United States Patent
Edwards

(10) Patent No.: US 10,573,578 B2
(45) Date of Patent: Feb. 25, 2020

(54) BONDPAD INTEGRATED THERMOELECTRIC COOLER

(71) Applicant: TEXAS INSTRUMENTS INCORPORATED, Dallas, TX (US)

(72) Inventor: Henry L. Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1835 days.

(21) Appl. No.: 13/798,592

(22) Filed: Mar. 13, 2013

(65) Prior Publication Data

US 2013/0187252 A1 Jul. 25, 2013

Related U.S. Application Data

(63) Continuation-in-part of application No. 12/790,688, filed on May 28, 2010, which is a continuation-in-part of application No. 12/201,679, filed on Aug. 29, 2008.

(60) Provisional application No. 61/182,052, filed on May 28, 2009, provisional application No. 61/182,055, filed on May 28, 2009, provisional application No. 60/968,805, filed on Aug. 29, 2007.

(51) Int. Cl.
*H01L 23/38* (2006.01)

(52) U.S. Cl.
CPC ................ *H01L 23/38* (2013.01)

(58) Field of Classification Search
None
See application file for complete search history.

(56) References Cited

U.S. PATENT DOCUMENTS

| | | | |
|---|---|---|---|
| 6,207,887 B1 * | 3/2001 | Bass | H01L 35/32 136/201 |
| 6,476,508 B1 * | 11/2002 | Strnad | G05D 23/1919 257/467 |
| 6,774,450 B2 * | 8/2004 | Inbe | H01L 23/38 136/201 |
| 2008/0173537 A1 * | 7/2008 | DeSteese | H01L 35/08 204/192.25 |
| 2009/0056345 A1 | 3/2009 | Edwards et al. | |
| 2011/0023929 A1 | 2/2011 | Edwards | |

* cited by examiner

*Primary Examiner* — Dustin Q Dam
(74) *Attorney, Agent, or Firm* — Michael A. Davis, Jr.; Charles A. Brill; Frank D. Cimino

(57) ABSTRACT

An integrated circuit has thermoelectric cooling devices integrated into bondpads. A method for operating the integrated circuit includes turning a thermal switch to a thermoelectric cooler operate position when the integrated circuit is powered up, turning the thermal switch to a thermoelectric cooler operate position to allow the thermoelectric cooler to operate when the integrated circuit powers down, and turning the thermal switch to a thermoelectric cooler off position when a predetermined integrated circuit chip temperature is reached.

8 Claims, 4 Drawing Sheets

BONDPAD INTEGRATED THERMOELECTRIC COOLER

This application is a continuation-in-part of application Ser. No. 12/790,688 filed May 28, 2010, which application Ser. No. 12/790,688 is a continuation-in-part of application Ser. No. 12/201,679 filed Aug. 29, 2008 and also claims priority from and the benefit of Provisional Application Nos. 61/182,052 filed May 28, 2009 and 61/182,055 filed May 28, 2009; which application Ser. No. 12/201,679 claims priority from and the benefit of Application No. 60/968,805 filed Aug. 29, 2007; the entireties of all of which are incorporated herein by reference.

BACKGROUND

This invention relates to the field of integrated circuits. More particularly, this invention relates to a thermoelectric device in an integrated circuit.

Integrated circuits generate heat while they are operating. As integrated circuits scale, the transistor density is increasing. However, the current through each transistor is remaining almost constant which means that the power density is also increasing. Circuit performance, especially in high performance circuits, is at times limited by the ability to remove the heat. A number of means are now being employed to remove heat more rapidly from an integrated circuit chip. Included in these are special packages, cooling fans, through silicon via channels through which coolant is pumped, and thermoelectric cooling units attached to the integrated circuit.

SUMMARY

A thermoelectric cooling device is integrated into the bondpads of an integrated circuit. A thermocircuit which enables the theremoelectric cooling device to continue to function when the integrated circuit is powered down.

DETAILED DESCRIPTION OF EXAMPLE EMBODIMENTS

On-chip thermoelectric coolers that may be formed at the same time as the integrated circuit are described, for example, in Pub. No. US 2009/0056345 A1, which is incorporated herein by reference.

Figure 1:
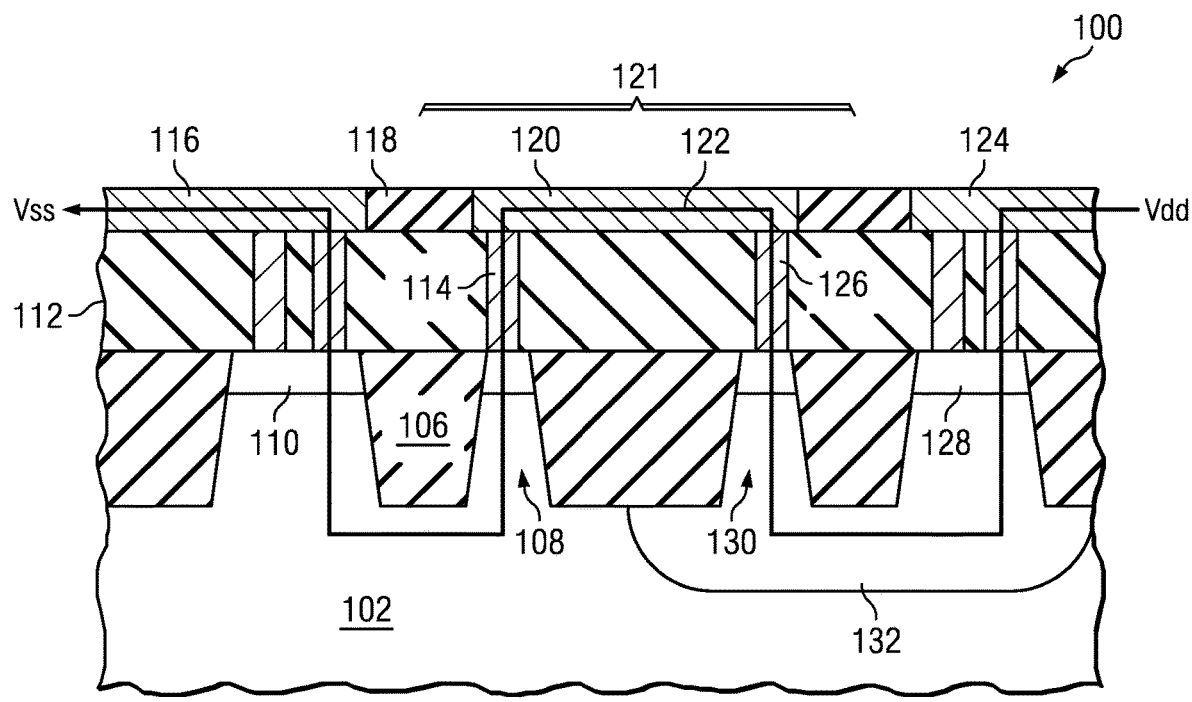
FIG. 1 is a cross-sectional view of a thermoelectric cooler.

An example thermoelectric cooler (thermocooler) 100 is shown in FIG. 1. Thermocooler 100 is formed in a p-type substrate 102 and includes an n-doped well (nwell) 132, shallow trench isolation (STI) 106, an p-type thermopile 108, a n-type thermopile 130, a heavily n-doped well contact region 128, a heavily p-doped well contact region 110, a premetal dielectric (PMD) 112, contacts 114 and 126, a first intermetal dielectric IMD-1 118, and metal-1 120. The n-type thermopile, 130, and the p-type thermopile 108 form a thermocouple, 121.

When current 122 (illustrated by the dark line arrow) flows through the thermocouple 121, heat (Q) is removed from the contacts 114, 126 and metal1 120, and is conveyed to the output terminals, 116, 124. Electrons dump heat at the Vdd terminal 124 and holes dump heat at the Vss terminal 116. The amount of heat per unit time that is removed from the contacts 114, 126, and the metal-1 120 through thermopiles 108, 130 is given by the Peltier equation, $Q=\Pi_{pn} I$, where $\Pi_{pn}$, the Peltier coefficient for the pn thermocouple 121, is the amount of heat that is removed from the conductive material which connects thermopiles 108, 130 per unit charge, and I (current) is the charge per unit time flowing through thermocouple 121.

A completed integrated circuit typically contains bondpads on the top surface which are used to provide power to the chip and also through which communication signals to other integrated circuit chips and devices are transmitted. Connections to the pins of the package may be formed by various means such as wirebonding or ballbonding. In a typical integrated circuit, a majority of the heat that is removed from the integrated circuit may be via conduction through the metal interconnects and dummy metal structures. Metal on the integrated circuits is a good conductor of heat and electricity whereas the insulating dielectric layers are poor conductors of heat and poor conductors of electricity. Heat spreaders and heat conductive epoxies may be used in forming the package to better remove heat from the integrated circuit.

Described in the following embodiment are thermoelectric cooling devices that are integrated with the bondpads of the integrated circuit. The thermoelectric cooling devices may be formed while the integrated circuit is being formed with no additional processing cost or cycle time. These thermoelectric cooling devices provide cooling to the integrated circuit by actively pumping heat out of the integrated circuit chip.

Figure 3:
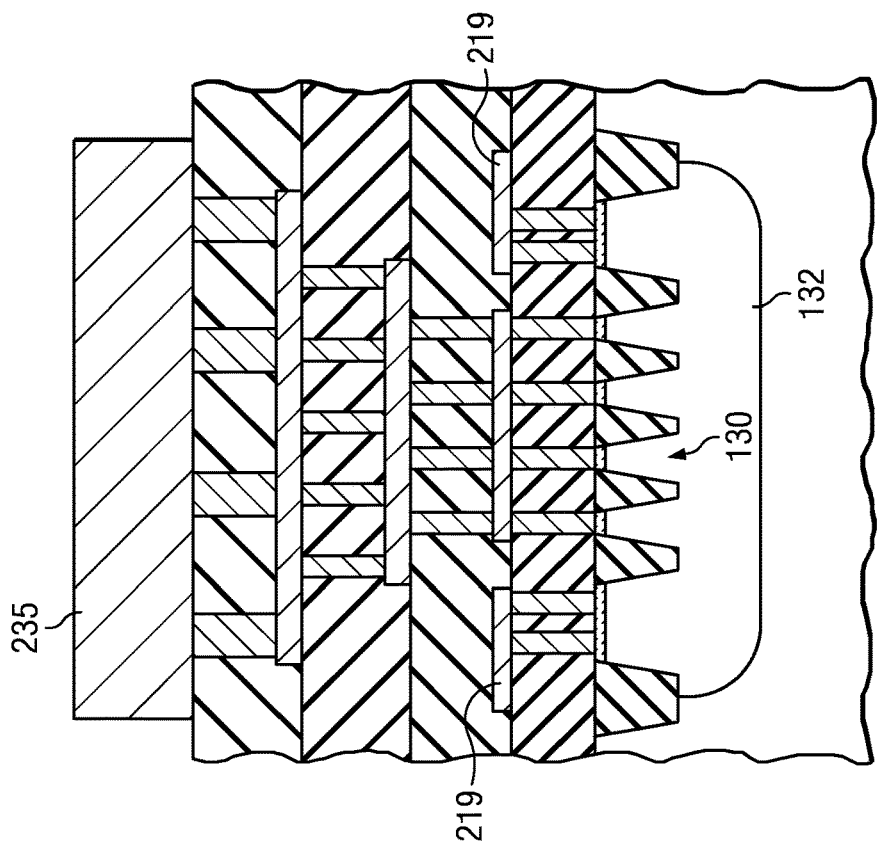
FIG. 3 is a cross-sectional view of an integrated bondpad thermoelectric cooler device according to principles of the invention.
Figure 2:
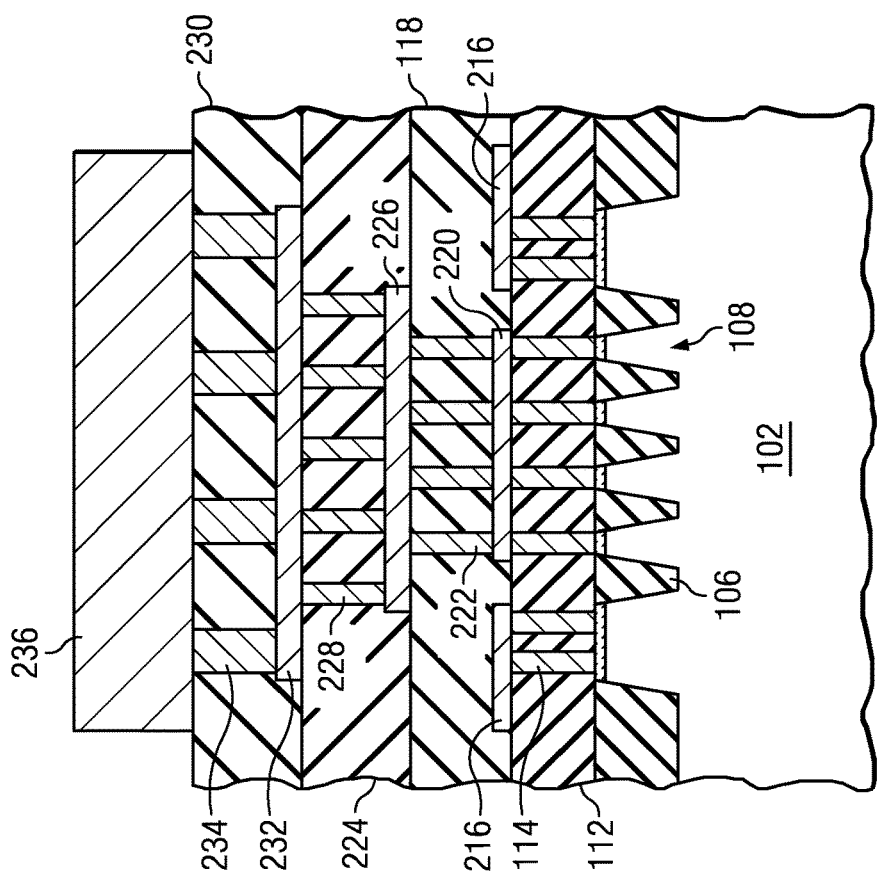
FIG. 2 is a cross-sectional view of an integrated bondpad thermoelectric cooler device according to principles of the invention.

Thermoelectric cooling devices that are integrated with the bondpads of an integrated circuit are illustrated in FIGS. 2 and 3. FIG. 2 is a p-type thermoelectric cooling device that is constructed in a p-type substrate 102, and FIG. 3 is an n-type thermoelectric cooling device constructed in an nwell 132. These two thermoelectric cooling devices may be constructed in the same integrated circuit chip.

The p-type thermoelectric device illustrated in FIG. 2 is composed of p-type thermopiles, 108, constructed in a p-type substrate, 102. Bondpad, 236, is coupled to the p-type substrate, 102, with contacts 114 plus several layers of metal interconnect and vias including metal-1 220, via-1 222, metal-2 226, via-2 228, metal-3 232, and via-3 234. This example embodiment uses four levels of interconnect. Other integrated circuits may include more or fewer layers of interconnect. Dielectric layers electrically isolate the interconnect, but also impede heat flow. This is desirable in the context of a thermoelectric cooler, because it is desired to cool the substrate and circuitry (including the metal layers) while using the Peltier effect to pump heat into the bondpad and out through the metal leads of the package. Dielectric layers include premetal dielectric PMD 112, intermetal dielectric IMD-1 118, IMD-2 224, and IMD-3 230. Use of low thermal conductivity dielectrics such as OSG, ULK, and FSG improves the performance of the thermoelectric cooler by reducing heat that is pumped out of the integrated circuit from leaking back into the integrated circuit by conduction through the dielectric.

The shallow trench isolation STI 106 typically is formed with trenches 200 to 500 nanometers deep that may be lined with a thermal or deposited dielectric such as oxide, oxynitride, or nitride and filled with a deposited oxide such as HDP prior to planarization. The active areas 106 which are connected to the bondpad 236 are constructed to be narrow lines or narrow posts of active to decouple electrons from phonons. Electrons transfer energy to the silicon lattice and heat the lattice via coupling and transferring energy to phonons. Restricting the active width 106 in at least one dimension to less than about 300 nm introduces quantum effects which decouple electrons from phonons. Preventing the electrons from transferring heat to the silicon crystal lattice reduces substrate 102 heating and also improves the efficiency of the thermoelectric cooler. During operation, current flows from terminals 216 to bondpad 236 and heat flows from terminals 216 to bondpad 236. The narrow active connections 106 significantly reduce heat conduction from the bondpad 236 into the substrate 102.

FIG. 3 illustrates an n-type thermoelectric cooler. This device is similar to the p-type thermoelectric cooler 200 of FIG. 2 except that it is constructed in an n-well 132. During operation, heat flows from terminal 219 to bondpad 235. Current flows from bondpad 235 to terminal 219.

Figure 4:
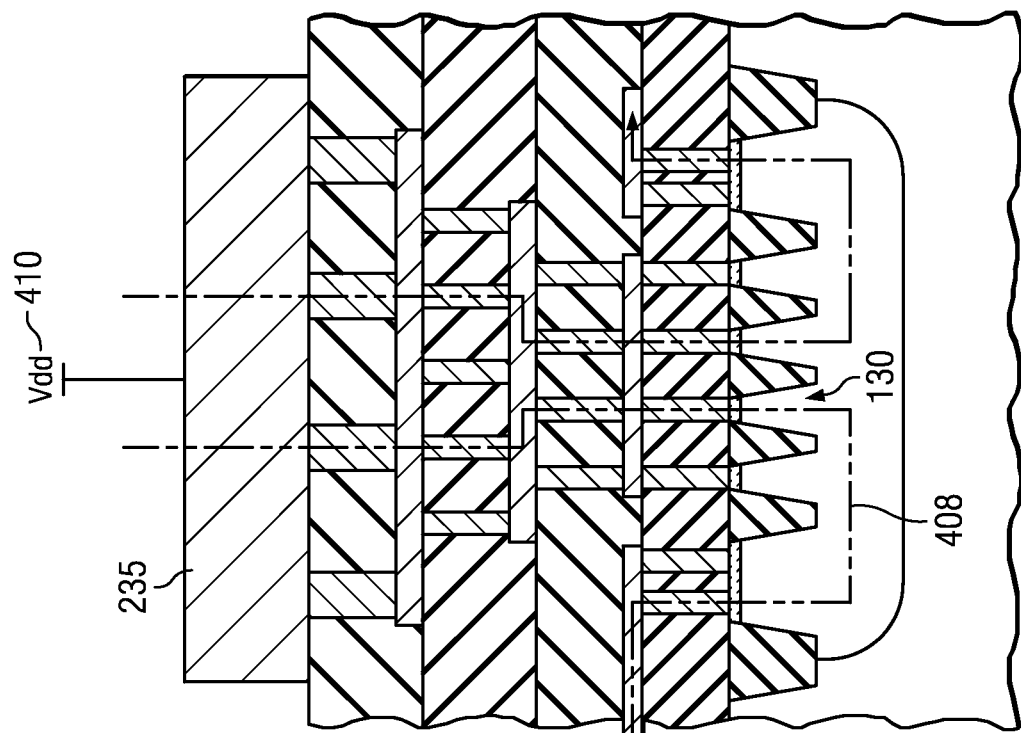
FIG. 4 is an integrated circuit formed according to principles of the invention.
Figure 4:
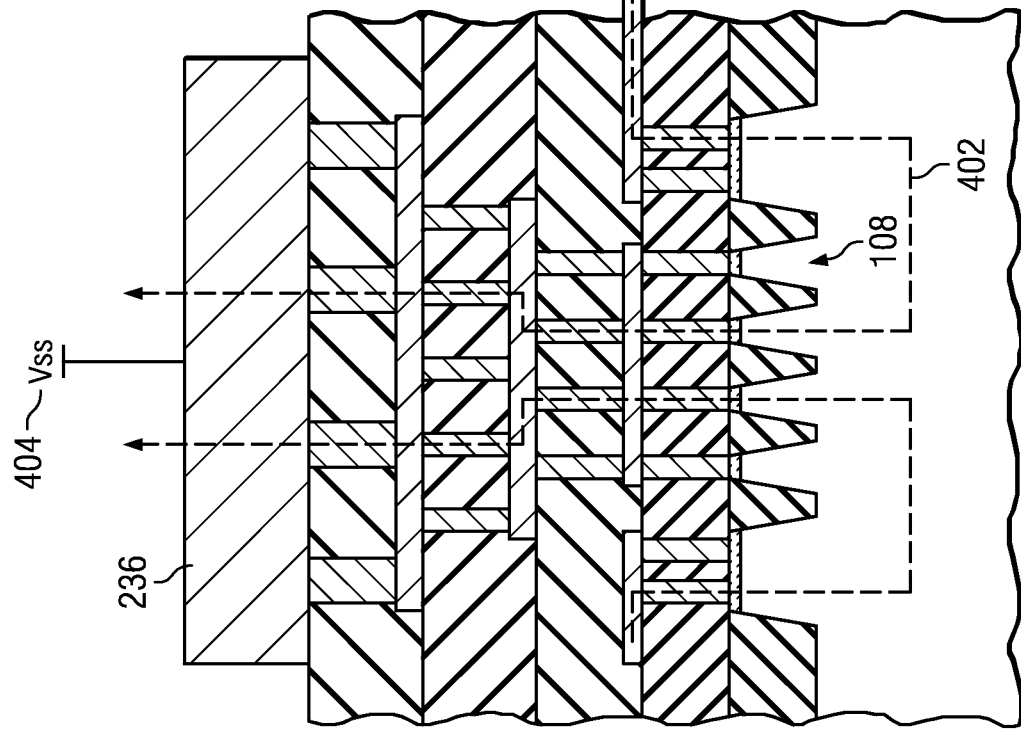

FIG. 4 illustrates the operation of the thermoelectric cooler. The current flows from Vdd 410 to Vss 404 and is illustrated by the bold dotted lines, 408, 402. As the current flows through p-type thermopile 108 and n-type thermopile 130 heat is pumped out of the integrated circuit 406 and into bondpads 235 and 236. Holes crossing thermopile 108 carry heat with them via the Peltier effect and deposit heat in bondpad 236. Electrons crossing thermopile 130 (opposite to current flow) also carry heat with them via the Peltier effect and deposit heat in bondpad 235. The narrow active thermopiles 108, 130 decouples the carriers from phonons greatly reducing conductive heat flow from the bondpads 235 and 236 back to the single crystal silicon substrate. The combination of Peltier cooling and improved thermal isolation due to the nano-sized active regions 108, 130 provides a heat pump that removes heat from an integrated circuit chip during operation.

The Peltier equation, $Q=\Pi_{pn} I$, gives the heat flow per unit time for a current flow equal to I. The Peltier coefficient, $\Pi_{pn}$, for silicon is approximately equal to 100 to 400 mV at room temperature. For a current of 1 mA, the heat flow is about 0.1 to 0.4 mW per thermal cooler. Thousands of the thermoelectric coolers may be formed under one bondpad thus achieving significant cooling. In addition, typical integrated circuit chips may have multiple bondpads for Vdd and Vss. Thermoelectric coolers may be formed under each of these bondpads for additional cooling.

Heat spreaders or heat sinks or cooling units may additionally be attached to the bondpads to aid in removal of the heat that is transported to the bondpads by the thermoelectric cooling devices.

Figure 5:
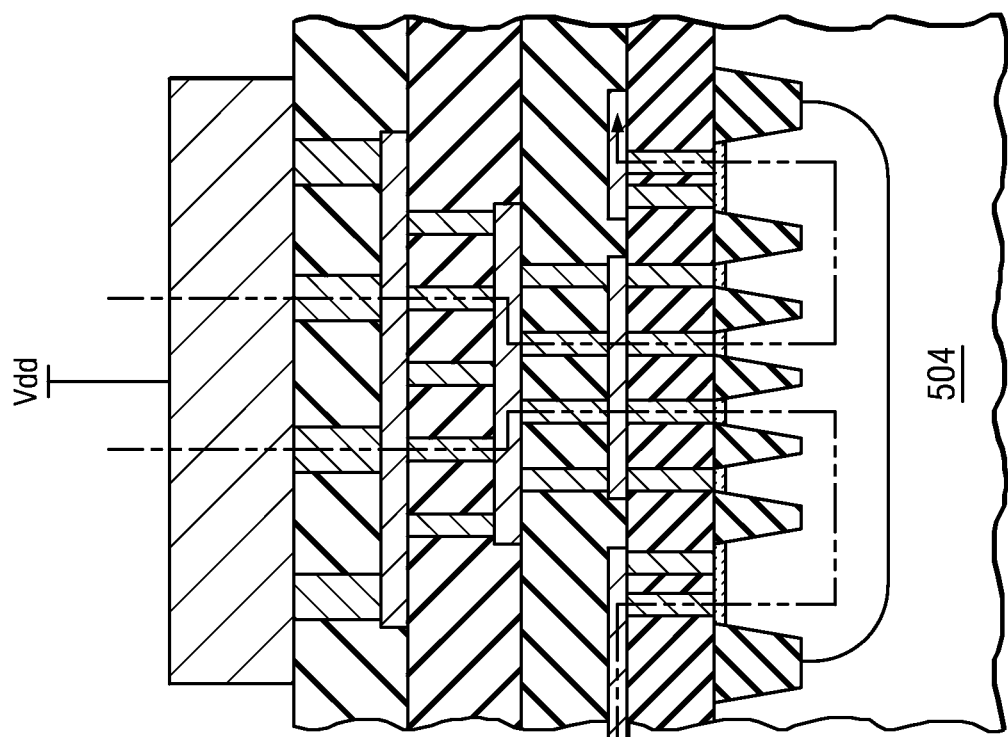
FIG. 5 is an integrated circuit formed according to principles of the invention.
Figure 5:
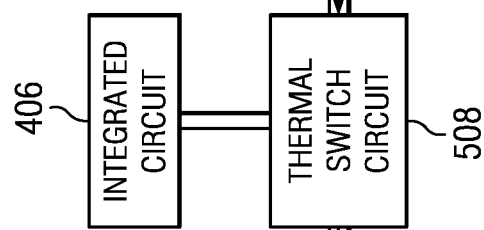
Figure 5:
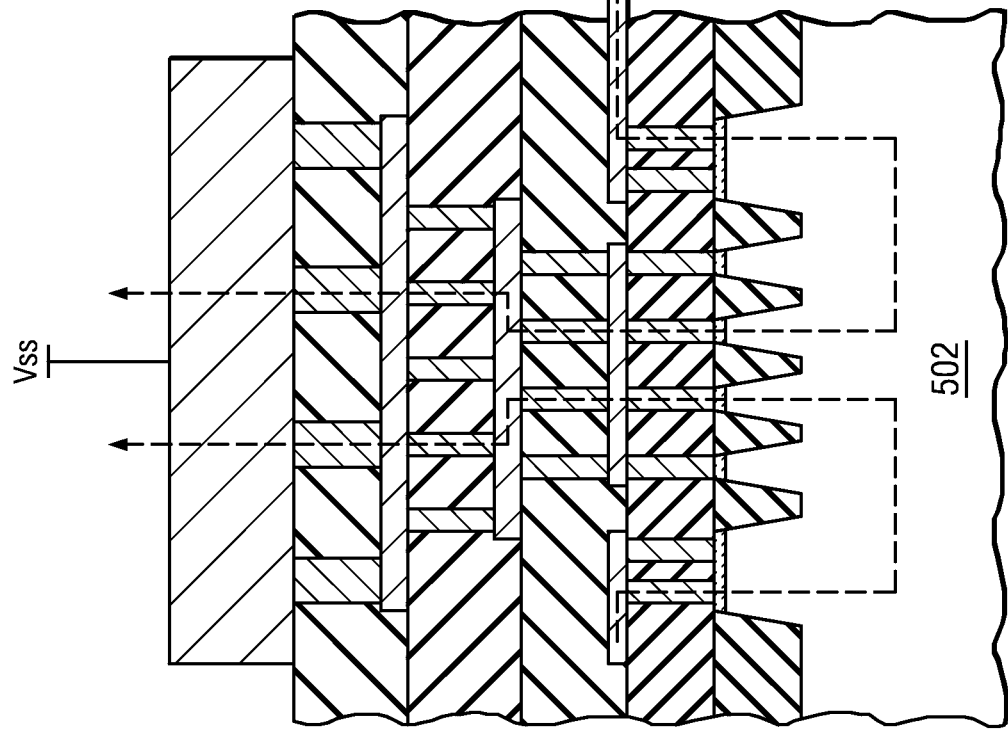

FIG. 5 illustrates yet another embodiment which adds a thermal switching circuit 508 that is coupled to the n-type 504 and p-type 502 thermoelectric coolers and to the integrated circuit 406. The thermal switching circuit 508 which may also contain control logic, may be used to keep the thermoelectric coolers operating during times when the integrated circuit 406 is powered down. For instance, the integrated circuit 406 may operate for a period of time causing the temperature of the integrated circuit chip to rise. When the integrated circuit is powered down and it may be desirable to keep the thermoelectric coolers 502, 504 operating to further cool the integrated chip and then to turn the thermoelectric cooler off when the integrated circuit chip has been cooled to a predetermined temperature or when the thermoelectric cooler has continued to operate for a predetermined time after the integrated chip has powered down.

Those skilled in the art to which this invention relates will appreciate that many other embodiments and variations are possible within the scope of the claimed invention.

What is claimed is:

1. An integrated circuit, comprising:
   a bondpad; and
   a thermoelectric cooler coupled to the bondpad, the thermoelectric cooler comprising thermopiles with at least one horizontal dimension less than 300 nm.

2. An integrated circuit, comprising:
   a first bondpad;
   a second bondpad;
   a thermoelectric cooler comprising: an n-type thermoelectric cooler coupled to the first bondpad, the n-type thermoelectric cooler formed in an n-doped well and composed of n-type active areas with at least one horizontal dimension less than 300 nm; and a p-type thermoelectric cooler coupled to the second bondpad, the p-type thermoelectric cooler formed in a p-doped well and composed of p-type active areas with at least one horizontal dimension less than 300 nm; and
   a thermal switch circuit coupled to the thermoelectric cooler.

3. The integrated circuit of claim 2, further comprising: interconnect layers; and a low thermoconductivity dielectric material in the interconnect layers.

4. An integrated circuit, comprising:
   a first bondpad;
   a second bondpad;
   an n-type thermoelectric cooler composed of n-type active areas with at least one horizontal dimension less than 300 nm formed in an n-doped well and coupled to the first bondpad; and
   a p-type thermoelectric cooler composed of p-type active areas with at least one horizontal dimension less than 300 nm formed in a p-doped well and coupled to the second bondpad.

5. The integrated circuit of claim 4, further comprising: interconnect layers; and a low thermoconductivity dielectric material in the interconnect layers.

6. The integrated circuit of claim 1, further comprising: interconnect layers; and a low thermoconductivity dielectric material in the interconnect layers.

7. The integrated circuit of claim 1, further comprising a thermal switch circuit coupled to the thermoelectric cooler.

8. The integrated circuit of claim 4, further comprising a thermal switch circuit coupled to the n-type thermoelectric cooler and to the p-type thermoelectric cooler.

* * * * *